(12) United States Patent
Spa

(10) Patent No.: US 6,537,359 B1
(45) Date of Patent: Mar. 25, 2003

(54) CONDUCTIVE INK OR PAINT

(75) Inventor: Wijchert H. Spa, Bellingwolde (NL)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/623,378

(22) PCT Filed: Mar. 2, 1999

(86) PCT No.: PCT/NL99/00108

§ 371 (c)(1),
(2), (4) Date: Oct. 18, 2000

(87) PCT Pub. No.: WO99/45077

PCT Pub. Date: Sep. 10, 1999

(30) Foreign Application Priority Data

Mar. 3, 1998 (NL) .............................................. 1008460

(51) Int. Cl.⁷ .............................. C09D 11/00; H01B 1/20
(52) U.S. Cl. ................................. 106/31.92; 106/31.64; 252/500; 252/510; 252/512; 252/514
(58) Field of Search ......................... 106/31.92, 31.32, 106/31.64; 252/500, 510, 512, 514

(56) References Cited

U.S. PATENT DOCUMENTS

| | | | |
|---|---|---|---|
| 4,220,411 A | | 9/1980 | Cowen ...................... 356/73.1 |
| 4,356,366 A | * | 10/1982 | Harper et al. .............. 106/1.05 |
| 4,371,459 A | | 2/1983 | Nazarenko .................. 252/514 |
| 4,964,948 A | * | 10/1990 | Reed ........................ 106/31.64 |
| 5,041,242 A | | 8/1991 | Fowle et al. ................. 252/511 |
| 5,089,173 A | * | 2/1992 | Frentzel et al. ............. 252/514 |
| 5,286,415 A | | 2/1994 | Buckley et al. ............. 252/502 |
| 5,389,503 A | * | 2/1995 | Evans et al. ................. 430/502 |
| 6,322,620 B1 | * | 11/2001 | Xiao ....................... 106/31.92 |

FOREIGN PATENT DOCUMENTS

| | | | |
|---|---|---|---|
| DE | 42 20 411 A1 | 12/1993 | |
| WO | WO 91/17550 | 11/1991 | ............ H01B/1/06 |

* cited by examiner

Primary Examiner—Helene Klemanski
(74) Attorney, Agent, or Firm—Charles W. Almer

(57) ABSTRACT

The invention relates to a deformable, electrically conductive ink or paint. When the ink or paint is applied to a substrate in the form of a particular pattern, this pattern will also be electrically conductive after deformation. The invention also relates to the use of a deformable, electrically conductive ink or paint for providing an electromagnetic shielding layer or a functionally conductive path.

24 Claims, 2 Drawing Sheets

CONDUCTIVE INK OR PAINT

Figure 1:
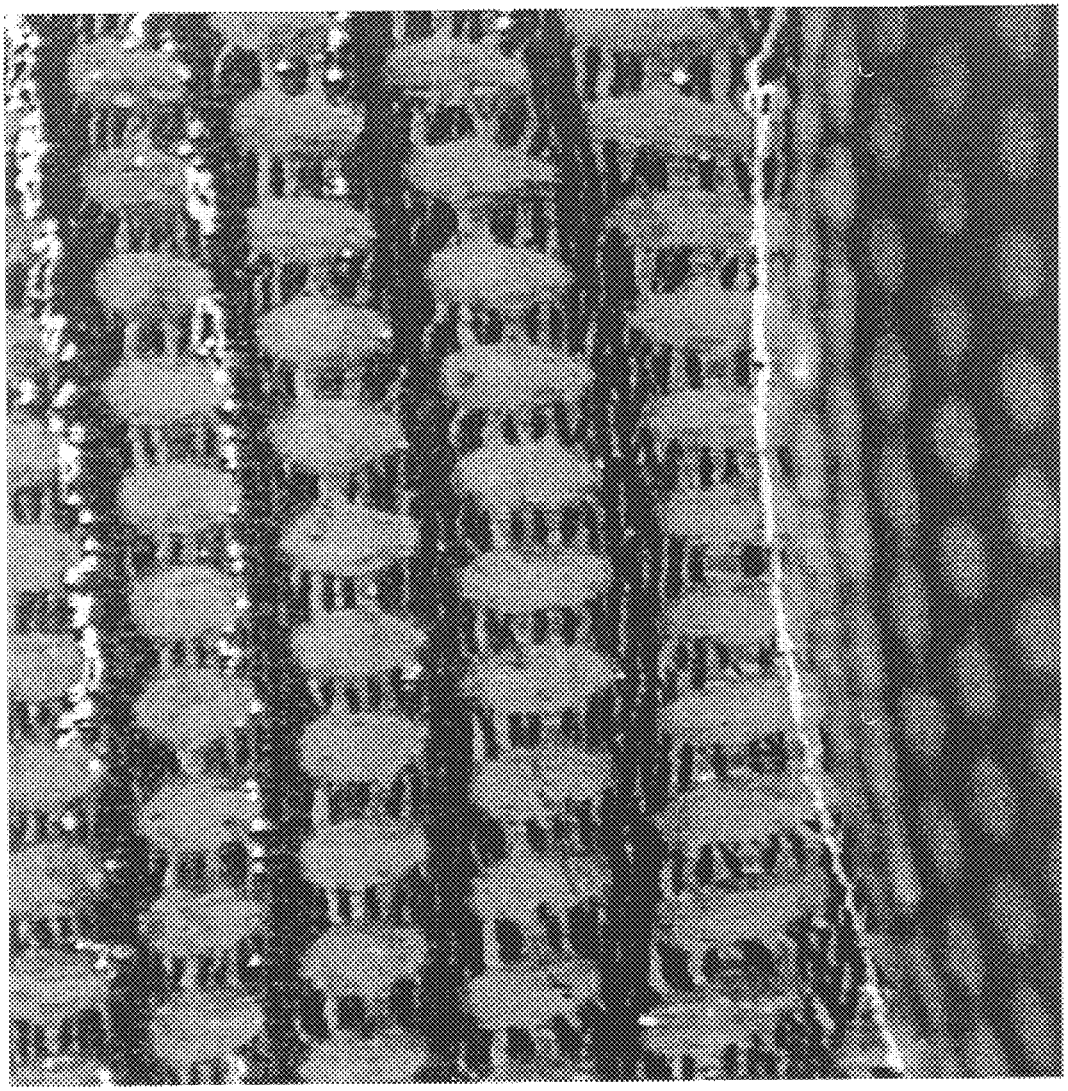

The invention relates to a conductive ink or paint and to the use thereof for applying an electromagnetic shielding layer to a substrate.

Electrically conductive inks or paints are used in different branches of industry. Some examples of utilization can be found in membrane switches, printed circuit boards, medical sensors, telephone equipment, printed switches, computer housings, heating elements and the like. The function of the ink or paint is to provide a functional conduction, with an electric current being conducted from one location to another, or to provide electromagnetic shielding. Electromagnetic shielding is in particular important in housings of electronic and electric equipment, such as transmitting and receiving equipment and mobile telephones.

In Polym.-Plast. Technol. Eng., 34(2), 271–346 (1995), Mottahed and Manoochehri have published a review of materials used, factors playing a part in the design of electromagnetic shielding layers, and test results in respect of electromagnetic interference shielding or EMI. On page 279, Table 4, a survey is given of different forms of use for realizing EMI. Important examples are conductive plastics, conductive paints, flexible laminates, metal foils and metal layers deposited under vacuum or chemically. The conductive paints are described as a particularly attractive form as far as costs are concerned.

An alternative to an electrically conductive paint is an electrically conductive ink with which, by means of a printing process, electromagnetic shielding layers can selectively be applied to plastic substrates. An electrically conductive ink generally consists of a dispersion of metal or carbon particles and suitable resins in organic solvents. As metal particles, copper, nickel, silver or silver-plated copper particles are usually used. The resin is generally a synthetic resin.

To save costs, the conductive ink or paint is usually selectively applied to the desired moulded parts in the form of a grid or another functional pattern. This requires less ink or paint than when the entire surface of a substrate is to be covered. A drawback of this is that the effectiveness of the shielding decreases substantially when a number of the connections present in such patterns are broken under the influence of temperature or mechanical forces during the production or the use of the equipment. For that reason, it is desired that the ink or the paint, in particular in the form of an applied, dried layer, be deformable.

The wish to have a deformable conductive ink or paint has only increased since the development of the so-called 'in-mould' and 'in-mould decoration' technologies. According to the in-mould technology, the ink or paint is provided in a die or mould, after which the material of the eventual moulded part is injection-moulded against the ink or paint layer in the form of a polymeric melt. In this respect, it is important that the ink bonds better to the material of the moulded part than to the mould.

According to a variant of the in-mould technique, the ink is first applied to a flat sheet (for instance a polycarbonate sheet), for instance by means of screen-printing. Next, the printed sheet is shaped into the desired, three-dimensional form in a die or mold (under the influence of temperature or mechanical forces) with the layer of ink or paint facing inside or outside, depending on the intended use, whereupon the material of the eventual moulded part is injection-moulded against the layer of ink or paint in the form of a polymeric melt. For a detailed description of this variant, the so-called 'in-mould decoration', reference is made to European Plastics News, February 1997, pp. 22–24. Further, it is advantageous that the screen-printing of the desired pattern can be performed on a flat plane. The traditional pad-printing technique, where the ink is applied to the finished, hence already formed, moulded part, is particularly labor-intensive and yields poorer results from an aesthetic viewpoint.

As stated, according to the in-mould decoration technology, a sheet, printed in flat form, is deformed into a desired shape. This deformation can be effected in a mould, but it is also possible to deform the printed sheet into the proper shape before the sheet is introduced into the mould. In both manners of deforming, use is made of the deformability of the material of the sheet. As the ink or paint pattern has already been applied to the sheet, the dried layer of ink or paint must likewise be deformable, because otherwise the pattern is damaged. In addition, the ink or paint used must have an excellent bonding capacity to both the material of the sheet and the material of the moulded part. Because an ink or paint that is sufficiently deformable as well as sufficiently electrically conductive is not available, the in-mould decoration technology is not yet used for manufacturing electromagnetic shielding layers or deformable conductive functional paths.

In international patent application WO-A-96/06438, a deformable, transparent shielding layer is described which is intended for discharging static electricity. The shielding layer consists for 30–70 wt. % of electrically conductive particles smaller than 20 $\mu$m and a thermoplastic resin. Examples of materials of which the conductive particles may consist, include antimony, or tin oxide doped with antimony, tantalum, niobium and phosphorus. As resins, saturated copolyesters are mainly mentioned. The electric conductivity of the shielding layer is so low, namely to the order of $10^5$ to $10^{13}$ ohms per square, that the layer cannot be referred to as electrically conductive and cannot be used as electromagnetic shielding layer.

It is an object of the invention to provide an ink or paint which combines an excellent electric conductivity with a good deformability. The object is to provide an ink or paint having such properties that a layer of the ink or paint applied can be deformed, after which the layer is still sufficiently electrically conductive. It is another object of the invention to provide an ink or paint which can be used for applying an electromagnetic shielding layer or a functionally conductive path to a moulded part utilizing the in-mould decoration technology.

Thus, the invention relates to a deformable, electrically conductive ink or paint.

Surprisingly, it has been found that it is possible to prepare an ink or paint which has such properties that after it has been applied to a substrate, it can be deformed to a considerable degree of elongation while it maintains a high electric conductivity. Owing to these properties, the ink or paint is extremely suitable for being used for forming electromagnetic shielding layers.

An ink or paint according to the invention is electrically conductive. This implies that the ink or paint, after being applied to a substrate, hence in dry form, has electrically conductive properties. According to the invention, a layer of ink or paint is electrically conductive when the surface resistance of the layer, at a layer thickness of 25 $\mu$m, is lower than 10,000 $\Omega/\square$. In this text, all surface resistances mentioned are based on a layer thickness of 25 $\mu$m. Inks or paints having a surface resistance higher than the surface resistance of air, which under standard conditions is 377 $\Omega/\square$, are not suitable for manufacturing electromagnetic shielding layers. For a functionally conductive path, a still lower surface resistance may be needed. For that reason, the ink or paint preferably has a surface resistance of 10 Ω/□ at most. The lower limit of the surface resistance is not particularly critical and will generally be determined by the nature of the materials of which the ink or paint consists. For practical reasons, the surface resistance will usually not be lower than 0.001 Ω/□.

Another important property of an ink or paint according to the invention is the deformability. By this term is meant the possibility of giving the ink or paint in dry condition, that is to say after having been applied to a substrate and drying, a different shape under the influence of temperature and/or (mechanical) pressure. In principle, this means that any other shape can be realized, although, in practice, it is particularly the elongation property that is important. The deformability of the ink or paint implies that the ink or paint in dry condition must have an elastic character.

In the prior art, several flexible conductive inks have been disclosed, for e.g. membrane touch switches (see for instance U.S. Pat. No. 4,371,459, WO-A-91/17550 or U.S. Pat. No. 5,286,415). Although these inks are flexible, they cannot be deformed (elongated) without losing their conductive properties to an unsatisfactorily extent. The term flexible is defined as to mean when the ink is subjected to forces such as twisting or bending, it is not released from the substrate to which it is applied and does not crack or break.

This flexibility is not sufficient for the applications which are envisaged for the present ink or paint, particularly not in the above described in-mould and in-mould decoration techniques. The deformation that the ink or paint of the present invention can withstand, may be permanent in character without having the result that the ink or paint suffers an unacceptable loss of conductive properties. In the annexed examples, one of the compositions disclosed in WO-A-91/17550 has been compared to an ink according to the present invention, showing the difference between flexibility and deformability.

According to the invention, it is essential that the two above-discussed properties of an ink or paint be combined. In other words, a dried layer of ink or paint according to the invention is deformable, and is still electrically conductive after deformation.

In most cases, the ink or paint will be applied in the form of one or more patterns (or circuits). In this regard, by pattern is meant a collection of interconnected points; this may be a completely filled surface as well as a collection of interconnected lines, or a combination of the two. According to the invention, the material of the ink or paint is chosen so that the existing connections between the points of the pattern are not broken by the deformation, at least not broken in such a manner that the pattern is no longer electrically conductive.

According to a preferred embodiment, a pattern formed by applying an ink or paint according to the invention can be thermally deformed to a degree of elongation of at least 30%, while the surface resistance of the pattern remains lower than 10,000 Ω/□, preferably lower than 377 Ω/□. In a particular preference, the pattern may be elongated by at least 50%, more preferably 75% to 100%, while still remaining electrically conductive. After elongation, the surface resistance is preferably 100 Ω/□ at the most, more preferably from 0.001 to 10 Ω/□ and most preferably from 0.05 to 10 Ω/□. The upper limit of the degree of elongation will often be dictated by the nature of the intended use. In practice, a degree of elongation of more than 60% usually does not prove to be necessary.

By the term 'degree of elongation' is meant the extent to which an article has been elongated as a result of a deformation. According to the invention, the degree of elongation of an ink or paint pattern is determined on the basis of the elongation of the article, such as a sheet, to which the ink or paint pattern has been applied. To this end, the sheet is clamped between two horizontal plates, which plates are both provided with a circular opening having a diameter of 80 mm at the same location relative to the center of the plates, while it is arranged that the openings are precisely in line. Next, the sheet is deep-drawn through these openings at a temperature of 230° C., by exerting pressure on the portion of the sheet which is left clear by the openings in the plates. The pressure required can be exerted by blowing air. This involves the sheet being deformed through the openings in the plates, to form a hemisphere. After cooling, the degree of elongation is determined by dividing the difference in thickness between the original, nondeformed sheet and the thinnest portion of the deformed, deep-drawn part of the sheet by the thickness of the original, nondeformed sheet. In other words, the degree of elongation is the ratio of the change of thickness of the sheet relative to the original thickness of the sheet.

An ink or paint according to the invention is preferably a composition comprising electrically conductive particles, a binding agent and a solvent.

It has been found that a highly favorable deformable, electrically conductive ink or paint can be prepared when the electrically conductive particles have the form of flakes. It has appeared that a pattern formed by applying an ink or paint on the basis of plate-shaped, electrically conductive particles can be elongated in two directions without an unacceptable increase of the surface resistance. In fact, it is also possible to use a mixture of powder-like and plate-shaped electrically conductive particles.

The plate-shaped, electrically conductive particles are preferably very flat. They preferably have a thickness of 2 μm at most, more preferably 1 μm at most. The lower limit for the thickness of the flakes is not critical and will for practical reasons usually be 0.1 μm. The surface of the flakes is determined by the so-called $d_{50}$-value. This value roughly indicates the maximum length of the flakes, with 50 vol. % of the flakes having a greater length, and 50 vol. % of the flakes having a smaller length. Preferably, the $d_{50}$-value ranges between 1 and 20 μm, while it is particularly preferred that it ranges between 10 and 15 μm. Although in principle, it is advantageous to use flakes having a largest possible surface, for particular applications it is desired to use smaller surfaces. In practice, this will depend on the technique selected for applying the ink or paint to a substrate. A skilled person will be able to select, on the basis of this information, flakes having a suitable surface.

The material of the electrically conductive particles should be selected so that it is available in the desired particle form. In addition, the material should be sufficiently electrically conductive. Materials that have proved to be particularly suitable are different forms of carbon, for instance graphite, metals and metal compositions. Preferably, the material of the particles is selected from the group consisting of silver, copper, silver-plated copper, nickel, iron, graphite and aluminum. Preferably, nickel, silver, copper or silver-plated copper is used. When silver-plated copper is used, the silver content will in most cases range from 1 to 35 wt. %, calculated on the total amount of metal.

Suitable binding agents for an ink or paint according to the invention are deformable, elastic, flexible and have a substantial adhesive capacity to the substrate for which the ink or paint is intended. In this regard, it should be observed that if the ink or paint is intended to be applied by the use of the above-described in-mould decoration technology, the binding agent must be sufficiently adhesive to both the sheet used and the polymeric material from which the eventually intended moulded part is manufactured. An example of a suitable binding agent is a thermoplastic resin.

The binding agent used is preferably a linear or branched polymer which is hardly crosslinked, if at all, and has a high elongation at break. It has been found that the use of binding agents having an elongation at break higher than 250% yields particularly well-deformable inks or paints.

Further, the binding agent preferably has a glass-transition temperature ranging between 10–70° C. It has appeared that an unduly high glass-transition temperature of the binding agent results in a ink or paint having an unduly high brittleness. When a binding agent is used whose glass-transition temperature is too low, an ink or paint is obtained whose viscosity is too low.

The weight-average molecular weight of the binding agent will usually range between 10,000 and 100,000, preferably between 20,000 and 90,000. The molecular weight distribution ($M_w/M_n$) of the binding agent is preferably narrow. It has been found that the use of a binding agent having a narrow molecular weight distribution yields an ink or paint which, after application, can be elongated extremely well. It is particularly preferred to use a binding agent having a molecular weight distribution of 4 at most, more preferably 3 at most. Both the weight-average molecular weight and the molecular weight distribution can suitably be determined by means of gel permeation chromatography (GPC). This technique, known per se, can in this respect be performed in a manner known to a skilled person with, for instance, tetrahydrofuran as solvent and polystyrene as external standard.

The polymer of which the binding agent consists, is preferably a polyester, polyurethane, polyacrylate, fluoroelastomer, a vinyl polymer or a mixture thereof. The binding agent can be a homo- or copolymer. Suitable monomers from which the binding agent can be built up comprise: vinylaromatic monomers, such as α-methyl styrene and styrene, acrylonitrile, methacrylonitrile, acrylamide, vinyl acetate, vinyl chloride, phenoxyethyl acrylate, multifunctional acrylates, such as hexanedioldimethyl acrylate, glycoldimethyl acrylate, divinyl benzene and esters of methacrylic acid or acrylic acid, or mixtures of these esters. Examples of suitable esters comprise alkyl esters, where the alkyl group may contain from 1 to 20 carbon atoms, alkoxyalkyl esters, such as butoxyethyl acrylate and butoxyalkyl methacrylate, and hydroxyalkyl esters. Other suitable monomers are acid monomers such as acrylic acid, methacrylic acid, maleic acid, dimethyl terephthalate, fumaric acid, crotonic acid, itaconic acid, aconitic acid and semi-esters thereof, and maleic acid anhydride and the like, monomers containing fluorine, such as vinylidene fluoride, hexafluoropropylene and tetrafluoroethylene, polyols, such as ethylene glycol and propylene glycol, and polyisocyanates, such as 2,4-toluene diisocyanate and hexamethylene diisocyanate. Particularly good results were obtained by the use of linear polyester urethanes or vinyl polymers as binding agent.

The solvent that can be used for the ink or paint is selected on the basis of the solubility of the binding agent to be used and the manner in which the ink or paint is to be applied to a substrate. As regards the manner in which the paint or ink is applied to a substrate, particularly the viscosity of the paint or ink is of importance. One of the factors influencing the viscosity is the solvent. Further, the compatibility of the substrate to which the ink or paint is to be applied, with the solvent plays a part. Examples of suitable solvents are ketones, such as methylethyl ketone (MEK), glycols, esters, such as glycol esters or butylacetate, and mixtures thereof. Given the nature of the intended substrate and the choice of the material of the electrically conductive particles and the binding agent, the skilled person will be able to select a suitable solvent.

Apart from the above components, the ink or paint may further contain additional substances which are normally used in conductive inks or paints. Examples of such additional substances are colorants, dispersants, lubricants, surfactants and other substances which can have a positive effect on the deformability of the ink or paint. In particular the use of a lubricant has proved to be advantageous. Suitable lubricants are, for instance, silicones, polyolefins and salts of fatty acids.

The quantities of the components of an ink or paint according to the invention are advantageously selected so that, after drying of the ink or paint applied, a weight ratio of electrically conductive particles to binding agent of 1:1–12:1, preferably between 2:1 and 9:1 is obtained. The liquid ink or paint will preferably contain 30–90 wt. %, more preferably 45–75 wt. % of solid substance, calculated on the weight of the liquid ink or paint, and 10–30 wt. %, preferably 15–25 wt. % of binding agent, calculated on the weight of the liquid ink or paint.

The invention further relates to a method for applying an ink or paint as described hereinabove to a substrate for forming a pattern (or circuit), which pattern can be thermally deformed to a degree of elongation of 100%, whereupon the pattern has a surface resistance of 377 Ω/□ at most.

The pattern provided may serve for realizing an electromagnetic shielding. It has been found that after deformation, a pattern applied according to the invention still provides excellent shielding. According to the invention, a shielding factor is expressed in decibel (dB). A suitable definition is described in the "EMI/RFI Shielding Guide" (a publication of GE Plastics, CCS-002, Pittsfield, USA). A shielding layer of an ink or paint according to the invention can be thermally deformed to a degree of elongation of at least 30%, after which the shielding factor is still at least 10 dB, preferably 30 dB.

The pattern provided can of course also serve as a functionally conductive path, with the pattern consisting of one or more paths or stripswhich are electrically conductive for conducting current from one particular location to another location for a specific purpose. Such functionally conductive paths can inter alia be found in a printed switch or a printed circuit board. Further, it is possible to use the pattern provided for generating a specific electric resistance. For this, the ink or paint is adjusted for this purpose in such a manner that the surface resistance of the pattern is higher, for instance up to about 10,000 Ω/□. A pattern having such surface resistance can for instance be used in a heating element.

The substrate to which the ink or paint is applied can be of any nature. In most cases, a substrate of a polymeric material (synthetic material) will be concerned. According to a preferred embodiment, the substrate is a sheet which is used in the above-described in-mould decoration technology. In this respect, suitable sheets are sheets which can be formed by casting or elongating, such as sheets made from polycarbonate, syndiotactic polystyrene, ABS, PVC and polyester.

It will be understood that the invention further relates to the use of the above-described ink or paint for applying an electromagnetic shielding layer or a functionally conductive path, preferably utilizing the in-mould decoration technique, or for articles formed by a deformation step (thus providing a three dimensional structure), after the ink or paint has been applied to that article. Examples of applications of the present ink or paint are printed circuit boards, printed switches, heating elements, medical sensors, membrane switches, housings of (mobile) telephones, PCs and computer monitors, television sets and the like, but may also be found in motorcar electronics.

The invention will presently be further explained on the basis of the following examples.

Comparative Example 1

Of a commercially available ink on the basis of silver particles (Electrodag 418 SS, Acheson), a pattern was printed on a polycarbonate sheet (Lexan 8B35, GE Plastics Structured Products, Bergen op Zoom). The pattern was formed by a layer having a thickness of about 10 $\mu$m in the form of a grid with round openings having a diameter of 0.9 mm, positioned at an angle of 45° relative to each other. The width of the conductive paths in the grid was 0.3 mm.

The sheet was deep-drawn to a degree of elongation of 40%. After this, determination of a surface resistance proved not to be possible. FIG. 1 shows that so many fractures, caused by the deformation, were formed in the grid, that conduction was no longer involved.

EXAMPLE 1

An ink was prepared by mixing the following components homogeneously:

| | |
|---|---|
| silver having flake structure | 54 wt. % |
| thickness of the silver flakes | 1 $\mu$m |
| $d_{50}$-value of the silver flakes | 6 $\mu$m |
| Arcosolv PM acetate* | 6.6 wt. % |
| Butylcarbitol | 19.5 wt. % |
| Morthane CA-47** | 18 wt. % |
| zinc stearate | 2 wt. % |

*commercially available from Dow Chemical Company
**$M_w$ = 80,000; $M_n$ = 30,000, commercially available from Morton International

EXAMPLE 2

A number of polycarbonate sheets (Lexan 8B35, GE Plastics Structured Products, Bergen op Zoom, The Netherlands) were printed with the ink prepared according to Example 1, to obtain an ink pattern as described in the Comparative Example.

The sheets were deep-drawn to a specific degree of elongation. From the hemispheres formed, strips having a width of about 1 cm were cut. The spots having the smallest layer thickness of the deformed sheet formed the center of the strips. Over these strips, so-called point-to-point resistances were measured as described in "Electrical Resistance Test Methods for EMI Coating Processes", Acheson Colloids Company, 1996. To this end, use was made of a RS Components Ltd. Stock No. 611-953 Low Ohm meter. The data are stated in Table 1.

TABLE 1

Resistance after deformation of the ink according to Example 1

| Thickness of the sheet before elongation ($\mu$m) | Thickness of elongated layer at thinnest spot ($\mu$m) | Height of hemisphere formed (mm) | Degree of elongation (%) | Resistance after elongation ($\Omega$) |
|---|---|---|---|---|
| 250 | 160 | 20 | 36 | 30 |
| 256 | 180 | 20 | 30 | 18 |
| 256 | 172 | 25 | 33 | 17 |
| 250 | 129 | 30 | 48 | 82 |
| 246 | 127 | 35 | 48 | 28 |

Figure 2:
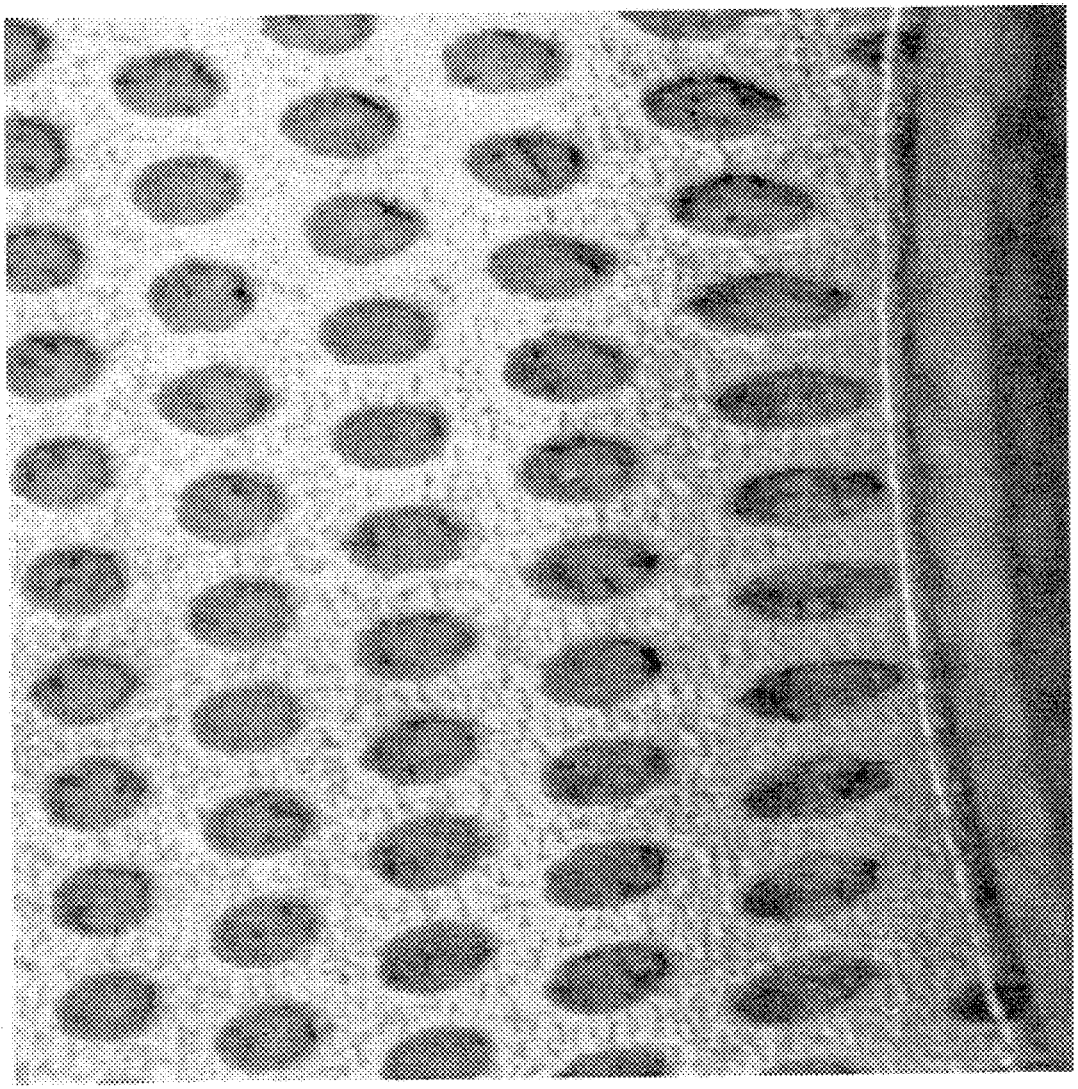

FIG. 2 shows a sheet printed with an ink according to the invention in a grid as described in the Comparative Example, which sheet is deformed to a degree of elongation of 40%. It is clearly visible that the conductive paths have not been broken.

Comparative Example 2

An ink was prepared as described in Example 2 of WO-A-91/17550, having the same ingredients with the exception of the solvent (Carbitol acetate). In order to compare the properties of this ink to the ink of the present invention as described in Examples 1 and 2, it must be applied to a polycarbonate substrate. The solvent used in WO-A-91/17550 chemically affects the polycarbonate material, leading to degradation of the subtrate. For this reason, a different solvent was used.

The ink was obtained by homogeneously mixing the following ingredients:

| | |
|---|---|
| Silver flakes | 61.5 wt. % |
| Triethanolamine | 0.12 wt. % |
| Vinyl acetate/vinyl chloride/ maleic acid terpolymer* | 5.0 wt. % |
| Polyester resin** | 5.0 wt. % |
| Butyl glycol acetate | 21.3 wt. % |
| Butylcarbitol | 7.1 wt. % |

*VMCA copolymer commercially available from Union Carbide, Danbury, CT, USA
**VITEL PE-222 commercially available from Goodyear Tire & Rubber Co. of Akron, OH, USA A number of polycarbonate sheets (Lexan 8B35, GE Plastics Structured Products, Bergen op Zoom, The Netherlands were printed with the above described ink, to obtain an ink pattern as described in Comparative Example 1. Subsequently, the sheets were deep-drawn and the point-to-point resistances were determined as described in Example 2. The results are shown in Table 2.

When the sheets where deformed to a degree of elongation higher than 20%, the resistance could not be measured. This means, with the resistance measuring device used, that the point-to-point resistance was larger than 200$\Omega$. Further, the ink pattern had changed color and distinct cracks in the pattern could be observed.

TABLE 2

Resistance after deformation of ink according to Comparative Example 2.

| Thickness of the sheet before elongation (μm) | Thickness of elongated layer at thinnest spot (μm) | Height of hemi-sphere formed (mm) | Degree of elongation (%) | Resistance after elongation (Ω) |
|---|---|---|---|---|
| 250 | 200 | 40 | 20 | 157 |
| 250 | 210 | 30 | 16 | 34 |
| 250 | 210 | 25 | 16 | 173 |

What is claimed is:

1. An electrically conductive, organic solvent based ink or paint comprising electrically conductive particles, a binding agent and a solvent, wherein the ink or paint, after having been applied to a substrate and dried, forms a pattern that can be thermally deformed to an elongation of at least 30% while maintaining a surface resistance of no greater than 10,000 Ω/□.

2. An ink or paint according to claim 1, wherein the pattern can be elongated by at least 50%.

3. An ink or paint according to claim 1, wherein the pattern, after elongation, maintains a surface resistance of 100 Ω/□ at most.

4. An ink or paint according to claim 1, wherein the electrically conductive particles are plate-shaped particles.

5. An ink or paint according to claim 4, wherein the electrically conductive particles are plate-shaped particles having a thickness of 2 μm at most and a $d_{50}$ value of 1–20 μm.

6. An ink or paint according to claim 4 or 5, wherein the electrically conductive particles are selected from the group consisting of metal and carbon particles.

7. An ink or paint according to any one of claims 4–6, wherein the binding agent is an elastic resin.

8. An ink or paint according to claim 7, wherein the resin has a molecular weight distribution ($M_w/M_n$) of 4 at most.

9. An ink or paint according to claim 7 or 8, wherein the resin has a glass-transition temperature of between 10 and 70° C.

10. An ink or paint according to any one of claims 4–9, wherein the ink or paint comprises 3–90 wt. % of solid substance, calculated on the total quantity of ink or paint.

11. A method for producing a pattern of ink or paint according to any one of the preceding claims on a substrate, wherein the ink or paint is applied to the substrate and dried to form a pattern, which pattern can be thermally deformed to a degree of elongation of 30%, after which the pattern has a surface resistance of 377 Ω/□ at most.

12. A method according to claim 11, wherein the pattern is deformed to a degree of elongation of at least 30% and has a surface resistance of 377 Ω/□ or less.

13. A coating in the form of a pattern obtainable by a method according to claim 11 or 12.

14. A method of providing an electromagnetic shielding layer or a functionally conductive path to a substrate comprising the step of applying the ink or paint of claim 1 to a substrate.

15. A method according to claim 14, further comprising the step of applying the ink or paint utilizing an in-mould or an in-mould decoration technique.

16. A substrate comprising an electromagnetic shielding layer or a functionally conductive path of an ink or paint according to claim 1.

17. A substrate according to claim 16, wherein the substrate is selected from the group consisting of a printed circuit board, a printed switch, a heating element, a medical sensor, a membrane switch, or a housing of a telephone, personal computer, computer monitor or television.

18. An ink or paint according to claim 2, wherein the pattern can be elongated by at least 75 to 100%.

19. An ink or paint according to claim 3, wherein the pattern, after elongation, maintains a surface resistance of 0.05–10 Ω/□.

20. An ink or paint according to claim 5, wherein the electrically conductive particles are plate-shaped particles having a thickness of 1 μm.

21. An ink or paint according to claim 4, wherein the electrically conductive particles are plate-shaped particles having a $d_{50}$ value of 10–15 μm.

22. An ink or paint according to claim 8, wherein the resin has a molecular weight distribution ($M_w/M_n$) of 3 at most.

23. An ink or paint according to any one of claim 10, wherein the ink or paint comprises 45–75 wt. % of solid substance, calculated on the total quantity of ink or paint.

24. An ink or paint according to claim 1, wherein the binding agent is a resin.

* * * * *